(12) United States Patent
Matsuda et al.

(10) Patent No.: US 6,380,681 B1
(45) Date of Patent: Apr. 30, 2002

(54) VIDEO DISPLAY AND MANUFACTURING METHOD THEREFOR

(75) Inventors: Yoshinari Matsuda; Yoshio Suzuki, both of Kanagawa; Ryota Odake, Tokyo; Nobutoshi Asai, Kanagawa, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/482,763

(22) Filed: Jan. 13, 2000

(30) Foreign Application Priority Data

Jan. 14, 1999 (JP) .......................................... 11-007611

(51) Int. Cl.⁷ ............................................... H01J 23/16
(52) U.S. Cl. ...................... 315/3; 315/169.1; 315/169.2; 315/169.3; 345/204; 345/206; 313/313
(58) Field of Search ..................... 315/3, 169.1, 169.2, 315/169.3; 345/204, 206; 313/313

(56) References Cited

U.S. PATENT DOCUMENTS

| 4,910,434 A | * | 3/1990 | Doumani et al. ............... 315/3 |
| 5,245,249 A | * | 9/1993 | Sakurai et al. ................. 315/3 |
| 5,703,394 A |   | 12/1997 | Wei et al. ..................... 257/433 |
| 5,777,610 A | * | 7/1998 | Sugimoto et al. ........... 345/206 |
| 6,121,988 A | * | 9/2000 | Uchiyama ................... 347/208 |
| 6,275,220 B1 | * | 8/2001 | Nitta .......................... 345/204 |

FOREIGN PATENT DOCUMENTS

| EP | 0 578 403 | 1/1994 | ............ H01J/31/12 |
| EP | 0 785 580 | 7/1997 | ........... H01L/27/15 |
| FR | 2 748 146 | 10/1997 | ............ G09G/3/20 |

OTHER PUBLICATIONS

Patent Abstracts of Japan, vol. 1997, No. 08, Aug. 29, 1997, JP 09 097812.
Patent Abstracts of Japan, "Connection of Circuit Board", Apr. 08, 1997, JP 09097812.

* cited by examiner

*Primary Examiner*—Don Wong
*Assistant Examiner*—Jimmy T. Vu
(74) *Attorney, Agent, or Firm*—Frommer Lawrence & Haug LLP; William S. Frommer; Samuel H. Megerditchian

(57) ABSTRACT

Disclosed herein are a video display and a manufacturing method therefor, more particularly, there is provided a video display including a display panel having a plurality of anodes and cathodes arranged orthogonally to each other so as to form grids, a printed wiring board having a drive circuit with wirings for driving the display panel and a plurality of bumps for electrically connecting the wirings of the drive circuit to the anodes and the cathodes, and an adhesive layer for bonding the display panel and the printed wiring board to form a multilevel structure. With this structure, a large-sized video image with no discontinuities can be displayed, and the thickness of the video display can also be reduced.

9 Claims, 6 Drawing Sheets

FIG. IA
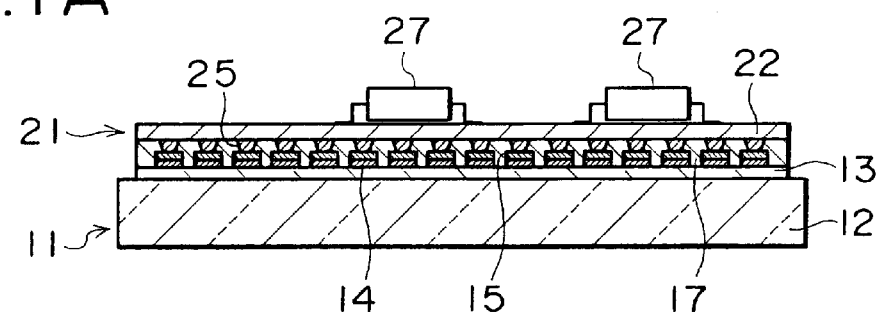
FIG. IB
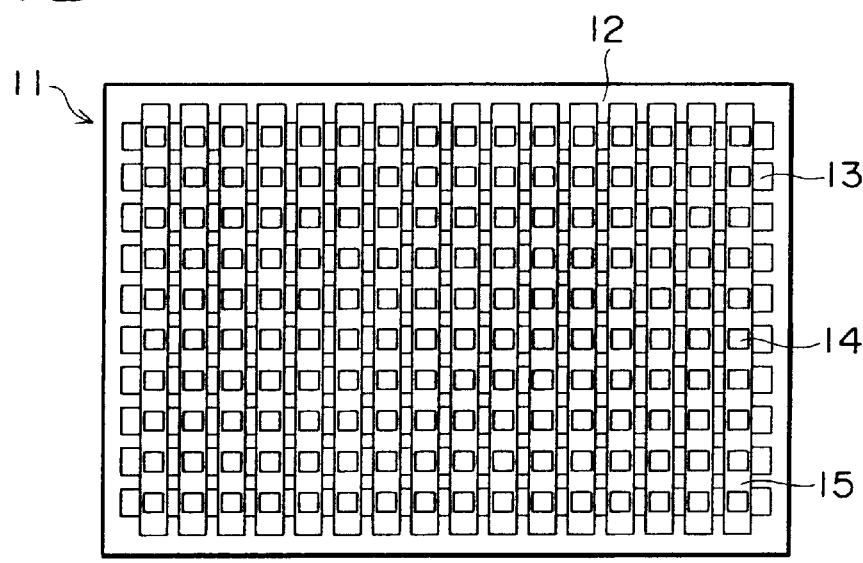
FIG. IC
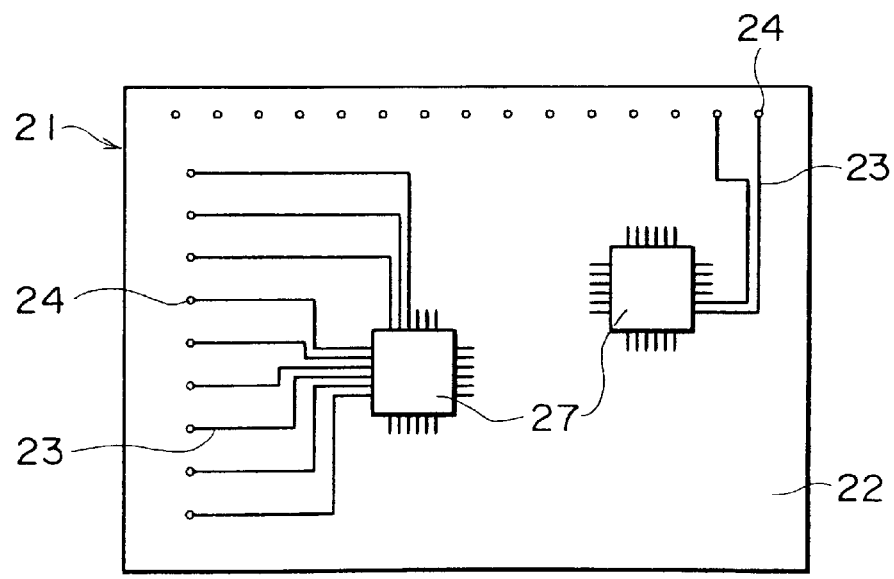

VIDEO DISPLAY AND MANUFACTURING METHOD THEREFOR

BACKGROUND OF THE INVENTION

The present invention relates to a video display having a display panel provided with anodes and cathodes arranged orthogonally to each other to form grids, and also to a manufacturing method for such a video display.

FIG. 5A is a plan view of a related art electroluminescent (EL) display panel in an active matrix drive type EL video display, and FIG. 5B is a cross section view taken along the line B—B in FIG. 5A. As shown in FIGS. 5A and 5B, the EL display panel 11 includes a glass substrate 12, a plurality of anodes 13 formed on one surface of the glass substrate 12 opposite to the display surface of the EL display panel 11 so as to be arranged in rows, for example, a plurality of EL phosphor layers 14 formed in the form of matrix, an insulating layer (not shown) formed on the EL phosphor layers 14, and a plurality of cathodes 15 formed on the insulating layer so as to be arranged in columns, for example.

To drive the EL display panel 11, a drive circuit must be connected to the anodes 13 and the cathodes 15. To this end, the related art EL display panel 11 shown in FIGS. 5A and 5B is formed with an L-shaped region 16 along adjacent two sides of the EL display panel 11 as a dedicated region for electrical connection of the anodes 13 and the cathodes 15 to the drive circuit. Although not shown, electronic components constituting the drive circuit are mounted on a printed wiring board separate from the EL display panel 11, and wirings formed on the printed wiring board are connected at first ends to the electronic components and connected at second ends to the anodes 13 and the cathodes 15 in the L-shaped region 16.

However, in the related art EL display panel 11 having the L-shaped region 16 dedicated for electrical connection, no video image is displayed in this region 16. Further, if the area of the EL display panel 11 is large, the yield of such large EL display panels manufactured is reduced. In addition, the area of the EL display panel 11 that can be manufactured is limited.

Accordingly, it is desirable to planarly join a plurality of EL display panels 11 as shown in FIG. 6 to thereby display a single large-sized video image. However, since no video image is displayed in each region 16, the large-sized video image displayed on the plural EL display panels 11 planarly joined has discontinuities corresponding to the regions 16. That is, a large-sized video image with no discontinuities cannot be displayed by the configuration shown in FIG. 6.

Furthermore, since the electronic components constituting the drive circuit are mounted on the printed wiring board separate from the EL display panel 11, the total thickness of the EL display panel 11 and the printed wiring board is large, so that it is difficult to reduce the thickness of the entire EL video display using the related art EL display panel 11 mentioned above.

SUMMARY OF THE INVENTION

It is accordingly an object of the present invention to provide a video display which can display a large-sized video image with no discontinuities and can be reduced in thickness.

It is another object of the present invention to provide a manufacturing method for the video display mentioned above.

In accordance with an aspect of the present invention, there is provided a video display comprising a display panel having a plurality of anodes and cathodes arranged orthogonally to each other so as to form grids; a printed wiring board having a drive circuit with wirings for driving the display panel and a plurality of bumps for electrically connecting the wirings of the drive circuit to the anodes and the cathodes; and an adhesive layer for bonding the display panel and the printed wiring board to form a multilayer structure. That is, the anodes and the cathodes of the display panel are electrically connected through the bumps to the wirings of the printed wiring board, and the display panel and the printed wiring board are bonded together through the adhesive layer. With this structure, the display panel is not required to have any dedicated region for electrically connecting the anodes and the cathodes of the display panel to the drive circuit for driving the display panel. Further, the total thickness of the display panel and the printed wiring board is small.

Preferably, the drive circuit comprises a plurality of electronic components mounted on one surface of the printed wiring board for driving the display panel, and the bumps are formed on the other surface of the printed wiring board. That is, the electronic components for driving the display panel are mounted on one surface of the printed wiring board opposite to its bump forming surface. With this structure, the electronic components for driving the display panel are integrated with the display panel.

In accordance with another aspect of the present invention, there is provided a manufacturing method for a video display, comprising the steps of preparing a display panel having a plurality of anodes and cathodes arranged orthogonally to each other so as to form grids; preparing a printed wiring board having a drive circuit with wirings for driving the display panel and a plurality of bumps for electrically connecting the wirings of the drive circuit to the anodes and the cathodes; forming an adhesive layer on any one of one surface of the display panel on which the anodes and the cathodes are provided and one surface of the printed wiring board on which the bumps are provided; and electrically connecting the anodes and the cathodes through the bumps to the wirings and bonding the display panel through the adhesive layer to the printed wiring board. That is, the anodes and the cathodes of the display panel and the wirings of the printed wiring board are electrically connected together through the bumps, and the display panel and the printed wiring board are bonded together through the adhesive layer. Accordingly, it is possible to manufacture a video display in which the display panel is not required to have any dedicated region for electrically connecting the anodes and the cathodes of the display panel to the drive circuit for driving the display panel, and the total thickness of the display panel and the printed wiring board can be reduced.

Preferably, the manufacturing method further comprises the step of mounting a plurality of electronic components for driving the display panel on the other surface, opposing to the surface with bumps, of the printed wiring board. That is, the electronic components for driving the display panel are mounted on one surface of the printed wiring board opposite to its bump forming surface. Accordingly, it is possible to manufacture a video display in which the electronic components for driving the display panel are integrated with the display panel.

Other objects and features of the invention will be more fully understood from the following detailed description and appended claims when taken with the accompanying drawings.

BRIEF DESCRIPTION OF THE DRAWINGS

FIG. 1A is a sectional side view of an EL video display according to a preferred embodiment of the present invention;

FIG. 1B is a plan view of an EL display panel constituting the EL video display shown in FIG. 1A;

FIG. 1C is a plan view of a flexible printed wiring board constituting the EL video display shown in FIG. 1A;

DETAILED DESCRIPTION OF THE PREFERRED EMBODIMENTS

Figure 2A:
FIGS. 2A to 2D are sectional side views showing a manufacturing method for the EL video display shown in FIG. 1A.

There will now be described a preferred embodiment of the present invention applied to an active matrix drive type EL video display and its manufacturing method with reference to FIGS. 1A to 4. In manufacturing the EL video display shown in FIGS. 1A to 1C, an EL display panel 11 is first prepared by sequentially forming anodes 13, EL phosphor layers 14, an insulating layer (not shown), and cathodes 15 on one surface of a glass substrate 12 which surface is opposite to the display surface of the EL display panel 11, by vapor deposition, CVD, etc. as shown in FIG. 2A.

Figure 5A:
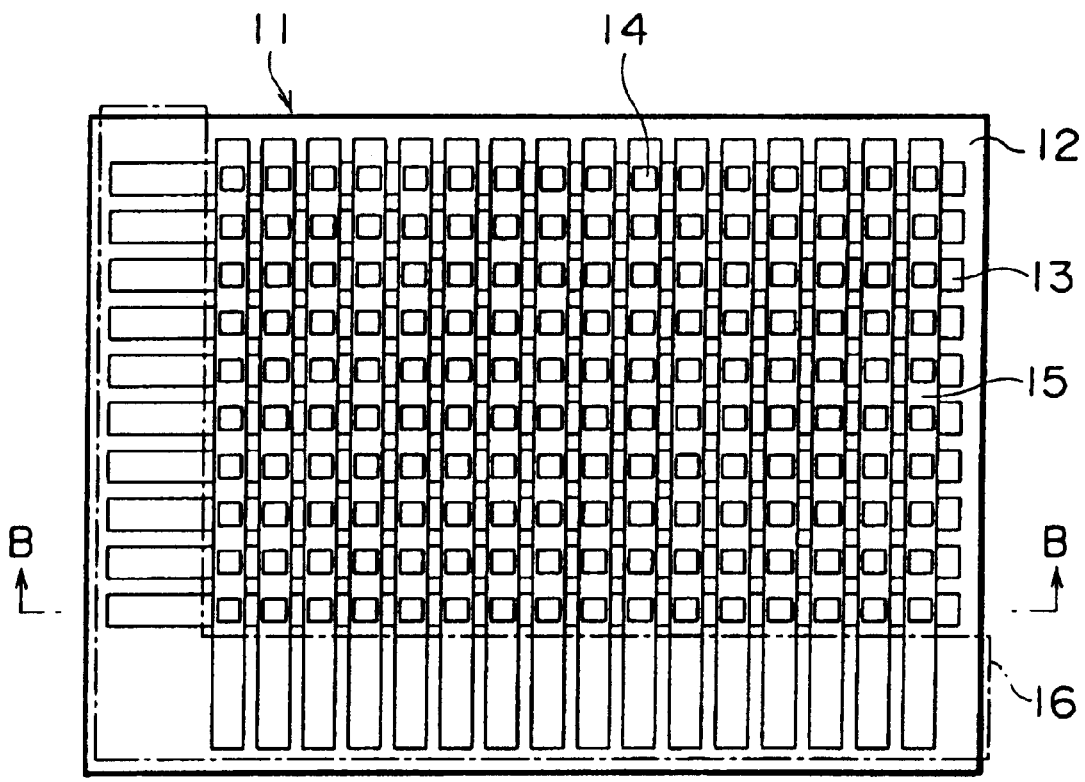
FIG. 5A is a plan view of an EL display panel in the related art.
Figure 5B:
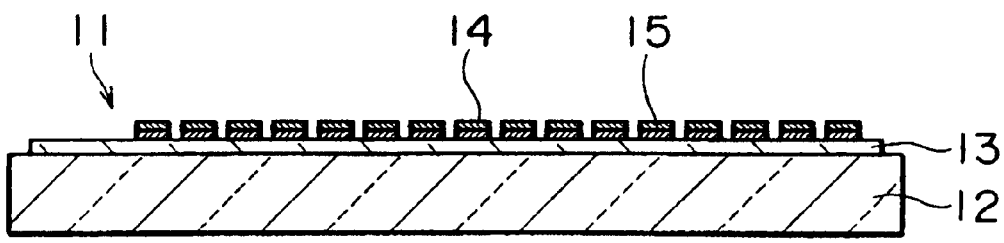
FIG. 5B is a cross section view taken along the line B—B in FIG. 5A.
Figure 6:
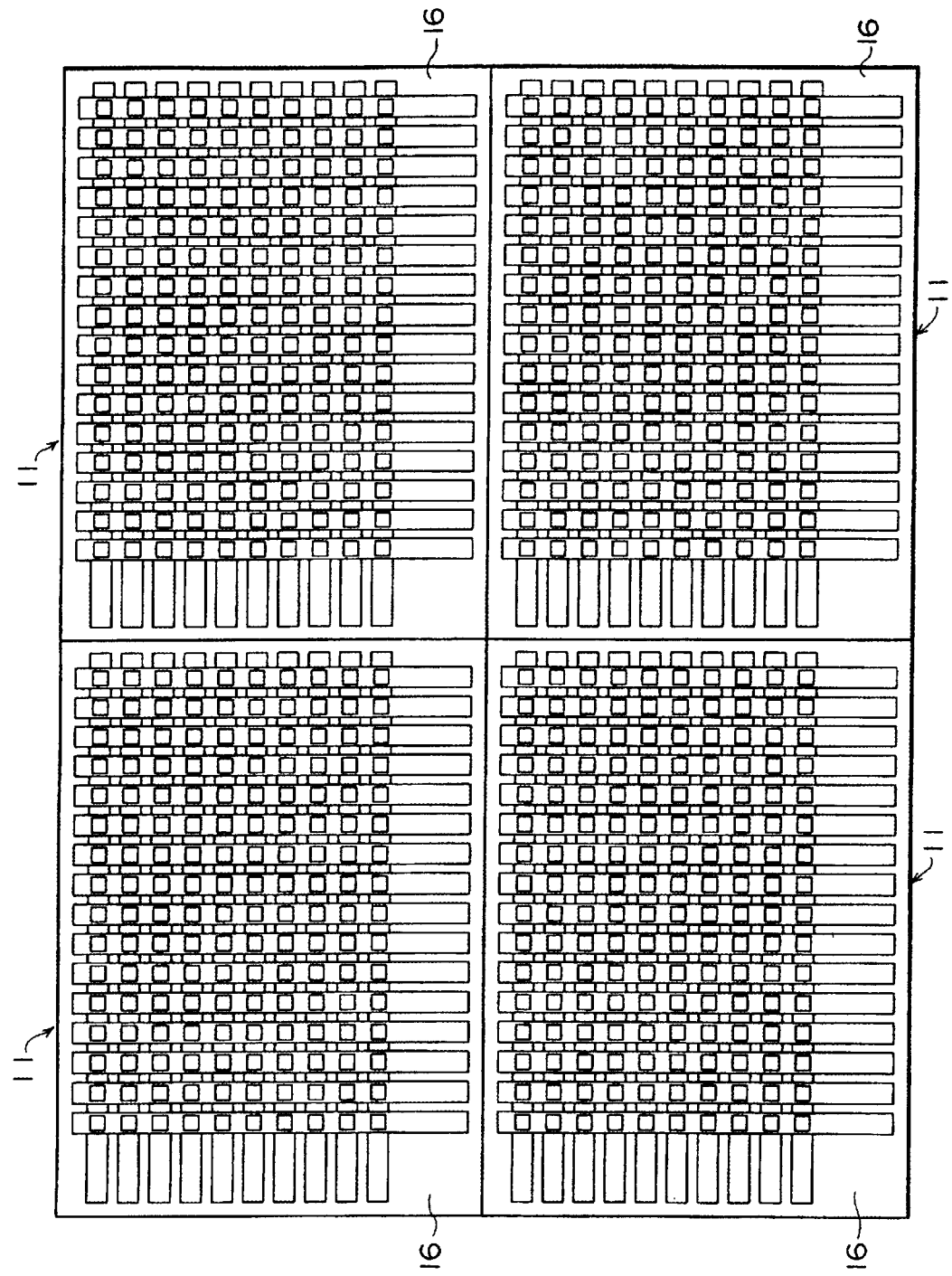
FIG. 6 is a plan view of a large-sized display panel obtained by planarly joining a plurality of EL display panels in the related art.

As shown in FIG. 1B, the anodes 13, the EL phosphor layers 14, and the cathodes 15 are formed substantially uniformly on the glass substrate 12, so that the EL display panel 11 has no L-shaped region dedicated for electrical connection as in the related art configuration shown in FIG. 5A. As usual, the anodes 13 are formed by vapor deposition of an aluminum layer or a chromium layer, for example, on an ITO (indium-tin oxide) layer, and the cathodes 15 are formed by vapor deposition of an aluminum layer or a gold layer, for example.

Figure 2B:
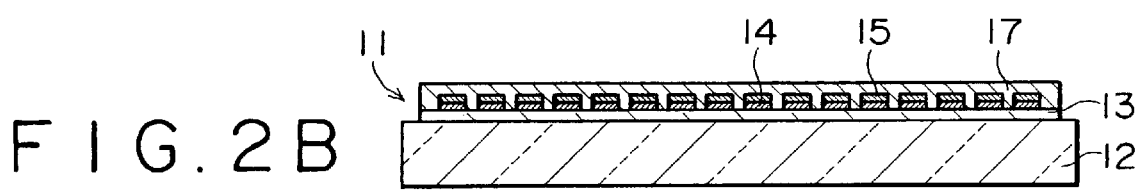

In the next step, an adhesive layer 17 is formed on the EL display panel 11 so as to cover the anodes 13, the EL phosphor layers 14, and the cathodes 15 as shown in FIG. 2B. The adhesive layer 17 is formed of a thermoplastic resin softening at a relatively low temperature, such as polyester, vinyl chloride, vinyl acetate, polyamide, and polyurethane. The adhesive layer 17 is formed on the EL display panel 11 by print coating of such a resin once heated to be softened or by thermal transfer of such a resin coated on a film.

Figure 2C:
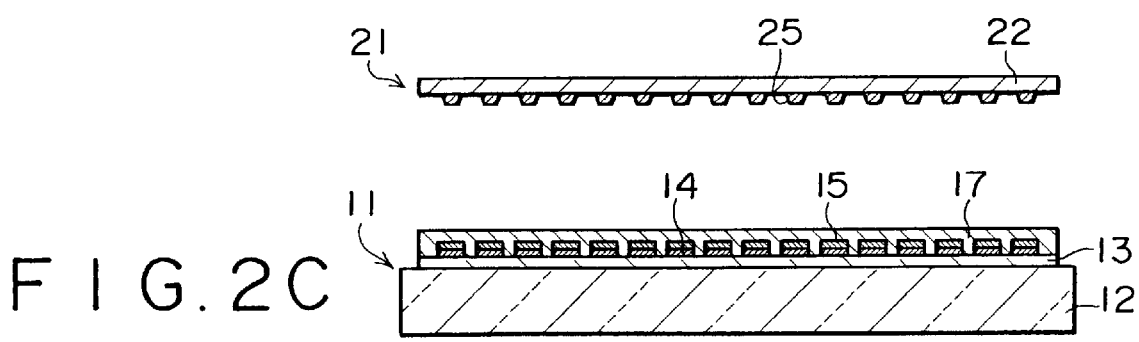

In the next step, a flexible printed wiring board 21 to be connected to the anodes 13 and the cathodes 15 of the EL display panel 11 is prepared as shown in FIG. 2C. The flexible printed wiring board 21 has a substrate 22 formed of a flexible material such as polyimide, polyethyleneterephthalate, liquid crystal polymer, and glass epoxy resin.

Figure 3A:
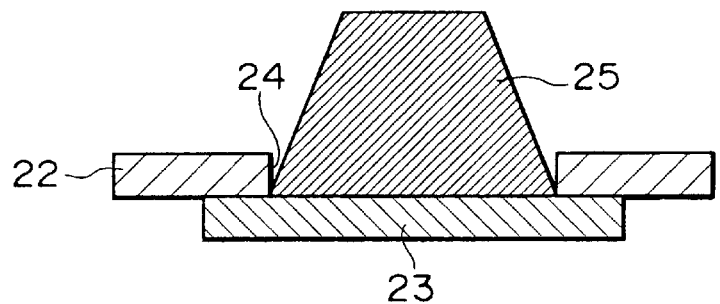
FIGS. 3A to 3D are sectional side views showing various preferred embodiments of a bump used in the EL video display shown in FIG. 1A.
Figure 3B:
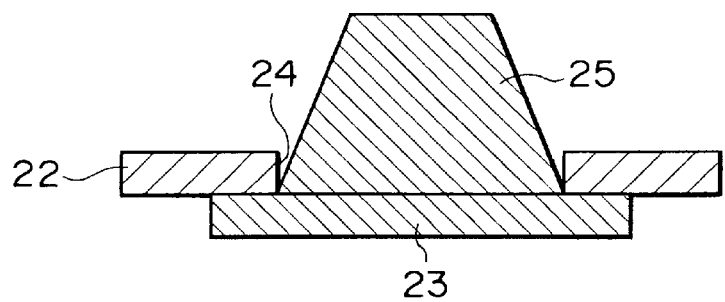
Figure 3C:
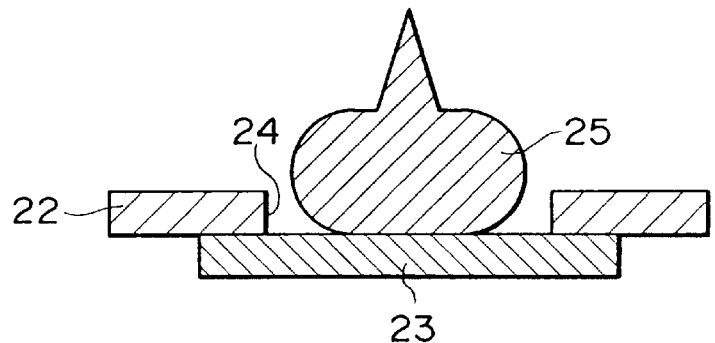
Figure 3D:
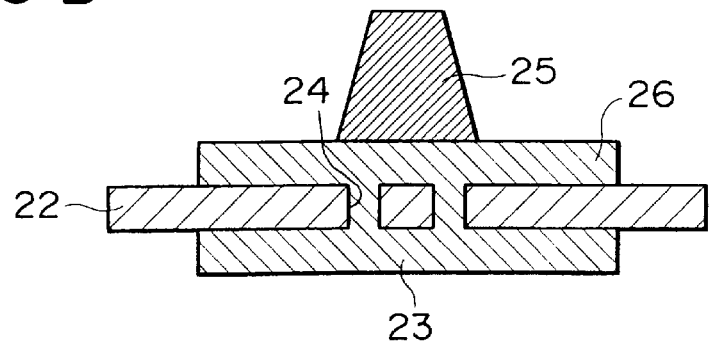

As shown in FIG. 1C and FIGS. 3A to 3D, foil-like copper wirings 23 are formed on one surface of the substrate 22 which surface is opposite to the lower surface of the substrate 22 as viewed in FIG. 2C opposing to the EL display panel 11. Further, a plurality of through holes 24 are formed in the substrate 22 at its peripheral portion along adjacent two sides of the substrate 22 where the copper wirings 23 are to be connected to the anodes 13 and the cathodes 15. FIGS. 3A to 3D show various preferred embodiments of a bump 25 formed of a conductive material for providing electrical connection of the copper wirings 23 to the anodes 13 and the cathodes 15. Each through hole 24 may have a relatively large size as shown in FIGS. 3A to 3C, or may have a relatively small size as shown in FIG. 3D.

In each of the preferred embodiments shown in FIGS. 3A to 3C, the bump 25 is formed in the relatively large through hole 24 so as to project from the substrate 22 to its upper side opposite to the copper wiring 23. In the preferred embodiment shown in FIG. 3D, a copper pattern 26 is formed in the relatively small through hole 24 and at a portion of the substrate 22 in the vicinity of the through hole 24 on the upper side opposite to the copper wiring 23, and the bump 25 is formed on the copper pattern 26 integrated with the copper wiring 23. In each of the preferred embodiments shown in FIGS. 3A to 3D, the height of the bump 25 is set to 10 $\mu$m to 100 $\mu$m.

The bump 25 shown in each of the preferred embodiments shown in FIGS. 3A and 3D is formed by print coating a conductive paste thermally curing at a relatively low temperature, such as a silver paste or a copper paste. The bump 25 shown in FIG. 3B is formed by forming a relatively thick copper film by electroplating or electroless plating, next forming a nickel coating on the surface of this copper film by electroless plating, and finally plating this nickel coating with gold or palladium.

In the bump 25 shown in FIG. 3B, the nickel coating is formed to facilitate the plating with gold or palladium, and the gold or palladium plate is formed to prevent oxidation of the copper film and thereby enhance stability of electrical contact. The bump 25 shown in FIG. 3C is formed by melting the tip of a gold wire to form a gold ball, next ultrasonic bonding the gold ball to the copper wiring 23, and finally tearing off the gold wire.

Figure 2D:
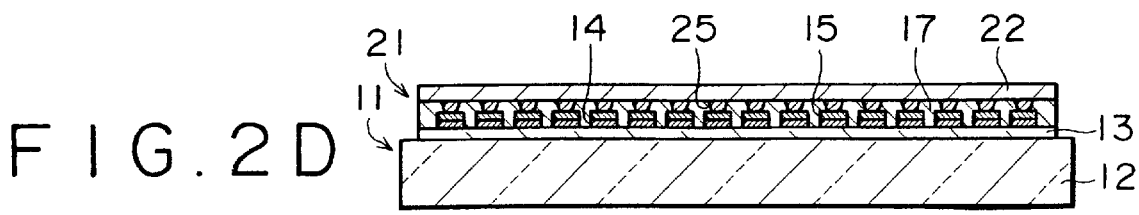

In the next step, the flexible printed wiring board 21 is put on the EL display panel 11 so that the bumps 25 are aligned with the anodes 13 and the cathodes 15 as shown in FIG. 2D. In this condition, the whole is heated to a temperature at which the adhesive layer 17 is softened, and pressure is applied to make the bumps 25 to be pressed onto the anodes 13 and the cathodes 15. Thereafter, the whole is cooled to harden the adhesive layer 17. As a result, the bumps 25 are electrically connected to the anodes 13 or the cathodes 15, and the flexible printed wiring board 21 is mechanically fixed to the EL display panel 11 by the adhesive layer 17.

In the next step, electronic components 27 constituting a drive circuit for driving the EL display panel 11 are bonded to the copper wirings 23 of the flexible printed wiring board 21 by soldering or conductive adhesive as shown in FIGS. 1A and 1C, thereby electrically connecting the electronic components 27 to the flexible printed wiring board 21 and mechanically fixing them together.

Figure 4:
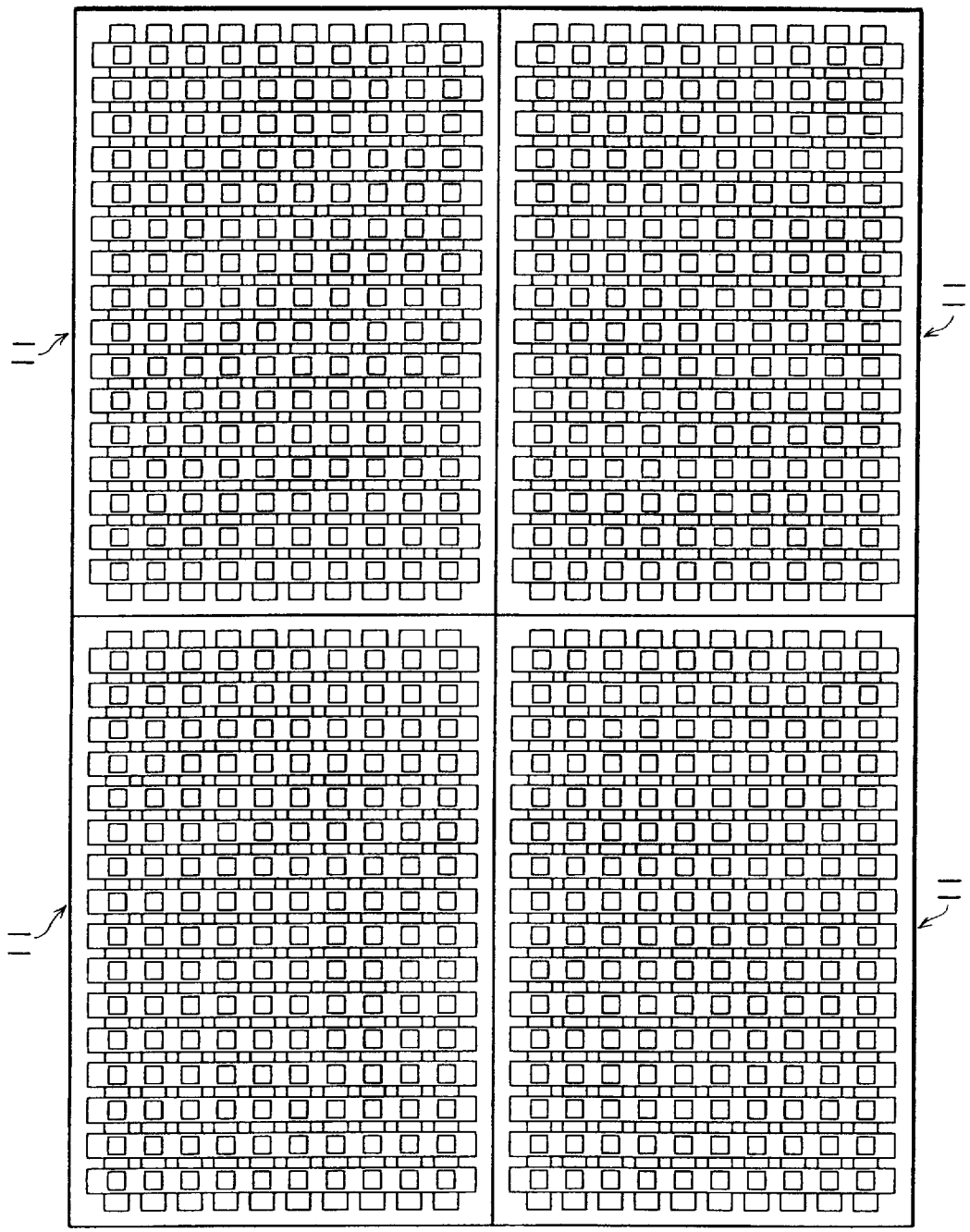
FIG. 4 is a plan view of a large-sized display panel obtained by planarly joining a plurality of EL display panels according to the preferred embodiment.

As apparent from FIG. 1B, in the EL video display manufactured by the above-mentioned method, the EL display panel 11 has no dedicated region for electrically connecting the anodes 13 and the cathodes 15 to the electronic components 27. Accordingly, by planarly joining a plurality of such EL display panels 11 in this preferred embodiment as shown in FIG. 4, a large-sized video image with joints thereof hardly seen can be created.

While the adhesive layer 17 is preliminarily formed on the EL display panel 11 as shown in FIG. 2B, the adhesive layer 17 may be preliminarily formed on the flexible printed wiring board 21. Further, while there has been described a specific preferred embodiment of the present invention applied to an active matrix drive type EL video display and its manufacturing method, the present invention is applicable also to any video displays other than the EL video display, such as a liquid crystal display, and their manufacturing method. Further, the EL video display according to the present invention may include a simple matrix drive type EL video display.

In the video display according to the present invention, the display panel is not required to have any dedicated region for electrically connecting the anodes and the cathodes of the display panel to the drive circuit for driving the display panel. Accordingly, by planarly joining a plurality of such display panels, a large-sized video image with no discontinuities can be displayed. Further, since the total thickness of the display panel and the printed wiring board is small, the thickness of the video display can be reduced as a whole.

Further, the electronic components for driving the display panel are integrated with the display panel, thereby facilitating handling, maintenance, etc.

In the manufacturing method for the video display according to the present invention, it is possible to manufacture a video display in which the display panel is not required to have any dedicated region for electrically connecting the anodes and the cathodes of the display panel to the drive circuit for driving the display panel, and the total thickness of the display panel and the printed wiring board can be reduced. Accordingly, a large-sized video image with no discontinuities can be displayed, and a thin video display can be manufactured.

Further, it is possible to manufacture a video display in which the electronic components for driving the display panel are integrated with the display panel. Accordingly, a video display with easy handling, maintenance, etc. can be manufactured.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A video display comprising:
    a display panel having a plurality of anodes and cathodes arranged orthogonally to each other so as to form grids;
    a printed wiring board on the back surface of the display panel having a drive circuit with a plurality of wiring members for driving said display panel and a plurality of bumps for electrically connecting said wiring members of said drive circuit to said anodes and said cathodes; and
    an adhesive layer for bonding said display panel and said printed wiring board to form a multilayer structure.

2. A video display according to claim 1, wherein said drive circuit comprises a plurality of electronic components mounted on one surface of said printed wiring board for driving said display panel, and said bumps are formed on the other surface of said printed wiring board.

3. A method of manufacturing a video display, comprising the steps of:
    preparing a display panel having a plurality of anodes and cathodes arranged orthogonally to each other so as to form grids;
    preparing a printed wiring board having a drive circuit with a plurality of wiring members for driving said display panel and a plurality of bumps for electrically connecting said wiring members of said drive circuit to said anodes and said cathodes;
    forming an adhesive layer on any one of one surface of said display panel on which said anodes and said cathodes are provided and one surface of said printed wiring board on which said bumps are provided; and
    electrically connecting said anodes and said cathodes through said bumps to said wiring members and bonding said display panel through said adhesive layer to said printed wiring board.

4. A manufacturing method according to claim 3, further comprising the step of mounting a plurality of electronic components for driving said display panel on the other surface, opposing to the surface with the bumps, of said printed wiring board.

5. A video display according to claim 1, wherein said display panel comprises an active matrix drive type electroluminescent display panel.

6. A video display according to claim 1, wherein said display panel comprises a liquid crystal display panel.

7. A video display according to claim 1, wherein said display panel comprises a simple matrix drive type electroluminescent display panel.

8. A video display according to claim 1, wherein each of said bumps comprises a bump formed by melting the tip of a gold wire to form a gold ball, next ultrasonic bonding said gold ball to a copper wiring, and finally tearing off said gold wire.

9. An image display system comprising a plurality of display panels which are arranged side by side so as to form a single screen, wherein each display panel comprises a plurality of anodes and cathodes arranged orthogonally to each other so as to form grids; a printed wiring board on the back surface of the display panel having a drive circuit with a plurality of wiring members for driving said display panel and a plurality of bumps for electrically connecting said wiring members of said drive circuit to said anodes and said cathodes; and an adhesive layer for bonding said display panel and said printed wiring board to form a multilayer structure.

* * * * *